US012614530B2

(12) United States Patent
Nagahara et al.

(10) Patent No.: US 12,614,530 B2
(45) Date of Patent: Apr. 28, 2026

(54) DISPLAY MEMBER

(71) Applicant: Panasonic Intellectual Property Management Co., Ltd., Osaka (JP)

(72) Inventors: Takayuki Nagahara, Osaka (JP); Tomonori Sugiyama, Osaka (JP); Kazuhiko Kaneuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/946,948

(22) Filed: Nov. 14, 2024

(65) Prior Publication Data

US 2025/0069562 A1 Feb. 27, 2025

Related U.S. Application Data

(63) Continuation of application No. PCT/JP2023/011220, filed on Mar. 22, 2023.

(30) Foreign Application Priority Data

May 23, 2022 (JP) ................................. 2022-084114

(51) Int. Cl.
*G09G 3/36* (2006.01)
*B60R 13/02* (2006.01)
(Continued)

(52) U.S. Cl.
CPC .......... *G09G 3/3614* (2013.01); *G06F 3/017* (2013.01); *H10K 59/50* (2023.02); *B60R 13/02* (2013.01);
(Continued)

(58) Field of Classification Search
None
See application file for complete search history.

(56) References Cited

U.S. PATENT DOCUMENTS

2021/0241721 A1* 8/2021 Matsumoto .............. G09G 5/02
2022/0017862 A1 1/2022 Brieva et al.
2023/0221471 A1 7/2023 Araya et al.

FOREIGN PATENT DOCUMENTS

JP 2005-231530 9/2005
JP 2020-020849 2/2020
(Continued)

OTHER PUBLICATIONS

International Search Report of PCT application No. PCT/JP2023/011220 dated May 30, 2023.

*Primary Examiner* — Parul H Gupta
(74) *Attorney, Agent, or Firm* — Wenderoth, Lind & Ponack, L.L.P.

(57) ABSTRACT

A display member includes an external appearance surface, a display layer having a first surface facing the external appearance surface and a second surface being opposite to the first surface and having a light transmission characteristic, and a decorative body facing the second surface of the display layer. The display layer has a display region on the first surface. The display member is configured to cause: (i) an output to be visually recognized in the display region when the display layer is turned on; and (ii) the decorative body to be visually recognized through the display region when the display layer is turned off.

18 Claims, 12 Drawing Sheets

(51) Int. Cl.
  *G02F 1/137*    (2006.01)
  *G06F 3/01*    (2006.01)
  *G06F 3/044*    (2006.01)
  *H10K 59/50*    (2023.01)

(52) U.S. Cl.
  CPC .......... *G02F 1/137* (2013.01); *G02F 2201/44*
        (2013.01); *G06F 3/0443* (2019.05); *G09G*
          *2320/0233* (2013.01); *G09G 2354/00*
          (2013.01); *G09G 2380/10* (2013.01)

(56)            References Cited

FOREIGN PATENT DOCUMENTS

| JP | 2021-133695 | 9/2021 |
| WO | 2020/194784 | 10/2020 |
| WO | 2020/223036 | 11/2020 |
| WO | 2022/004581 | 1/2022 |

* cited by examiner

DISPLAY MEMBER

TECHNICAL FIELD

The present disclosure relates to a display member, and more particularly to a display member having a decorating function.

BACKGROUND ART

Conventionally, a display member having a decorating function is used for an electrical appliance, an automobile part, or the like. This type of display member is provided with a design for decoration, for example, a woodgrain pattern imitating wood, a stone grain pattern imitating stone, and the like on an external appearance surface. When the display member is turned off, the external appearance surface provided with the design for decoration is visually recognized, and excellent designability can be expressed. At the time of lighting, operation information can be displayed by illuminating a display provided on the back side of the external appearance surface. Further, a touch panel type decoration display device on which a touch panel substrate is mounted is also used.

Examples of a touch panel type decoration display device include a vehicle decoration display device described in Unexamined Japanese Patent Publication No. 2021-133695 (hereinafter, "JP 2021-133695"). FIG. 11 is a cross-sectional view showing a configuration of vehicle decoration display device 1 of JP 2021-133695. FIG. 12 is a top view illustrating display 2 of vehicle decoration display device 1 in FIG. 11. As shown in FIG. 11, vehicle decoration display device 1 disclosed in JP 2021-133695 includes display 2 that emits light to display an image, light-transmissive touch panel substrate 3 disposed on an upper layer of display 2, and light-transmissive decorative body 4 disposed on an upper layer of touch panel substrate 3. As illustrated in FIG. 12, display 2 has a plurality of selective light emission regions 21.

In vehicle decoration display device 1 of JP 2021-133695, when display 2 is in the turn-off mode, a design derived from the pattern of decorative body 4 is clearly displayed on the surface of decoration display device 1. When display 2 is in the turn-on mode, a part of selective light emission region 21 of display 2 is turned on to display an image according to a user's operation command detected by touch panel substrate 3.

CITATION LIST

Patent Literature

PTL 1: Unexamined Japanese Patent Publication No. 2021-133695

SUMMARY OF THE INVENTION

However, in the configuration of vehicle decoration display device 1 of JP 2021-133695, display 2 is disposed on the lower layer side of decorative body 4. In such a configuration, when display 2 is turned on, the external appearance pattern applied to decorative body 4 is visually recognized while covering the display of display 2. As a result, display quality of display 2 is deteriorated. In order to display an image on display 2 through decorative body 4 on the upper layer, decorative body 4 is required to have a light transmission characteristic. For example, decorative body 4 of vehicle decoration display device 1 of JP 2021-133695 is configured by printing a woodgrain pattern on a light-transmissive resin film using a light-transmissive paint. Therefore, in the conventional decoration display device, it is difficult to use a real material having a low degree of freedom in material selection of the decorative body, a light non-transmission characteristic, and higher decorative quality.

Therefore, an object of the present disclosure has been made in view of the above circumstances, and an object of the present disclosure is to provide a display member having a high degree of freedom in material selection of a decorative body and improving display quality of a display at the time of lighting.

In order to achieve the above object, a display member according to one aspect of the present disclosure includes an external appearance surface, a display layer having a first surface facing the external appearance surface and a second surface opposite to the first surface and having a light transmission characteristic, and a decorative body disposed facing the second surface of the display layer. The display layer has a display region on the surface on the side of the external appearance surface. The display member causes the output to be visually recognized in the display region when the display layer is turned on, and causes the decorative body to be visually recognized through the display region when the display layer is turned off.

According to the display member according to one aspect of the present disclosure, it is possible to provide a display member having a high degree of freedom in material selection of a decorative body and improving display quality of a display at the time of lighting.

BRIEF DESCRIPTION OF THE DRAWINGS

FIG. 2 is a schematic cross-sectional view taken along line A-A illustrating an example of a configuration of a display member in FIG. 1.

FIG. 4 is a top view illustrating an external appearance surface of a display member according to a second exemplary embodiment of the present disclosure.

FIG. 5 is a schematic cross-sectional view taken along line B-B illustrating an example of a configuration of the display member in FIG. 4.

FIG. 8 is a schematic cross-sectional view taken along line C-C illustrating an example of a configuration of the display member in FIG. 7.

Figure 11:
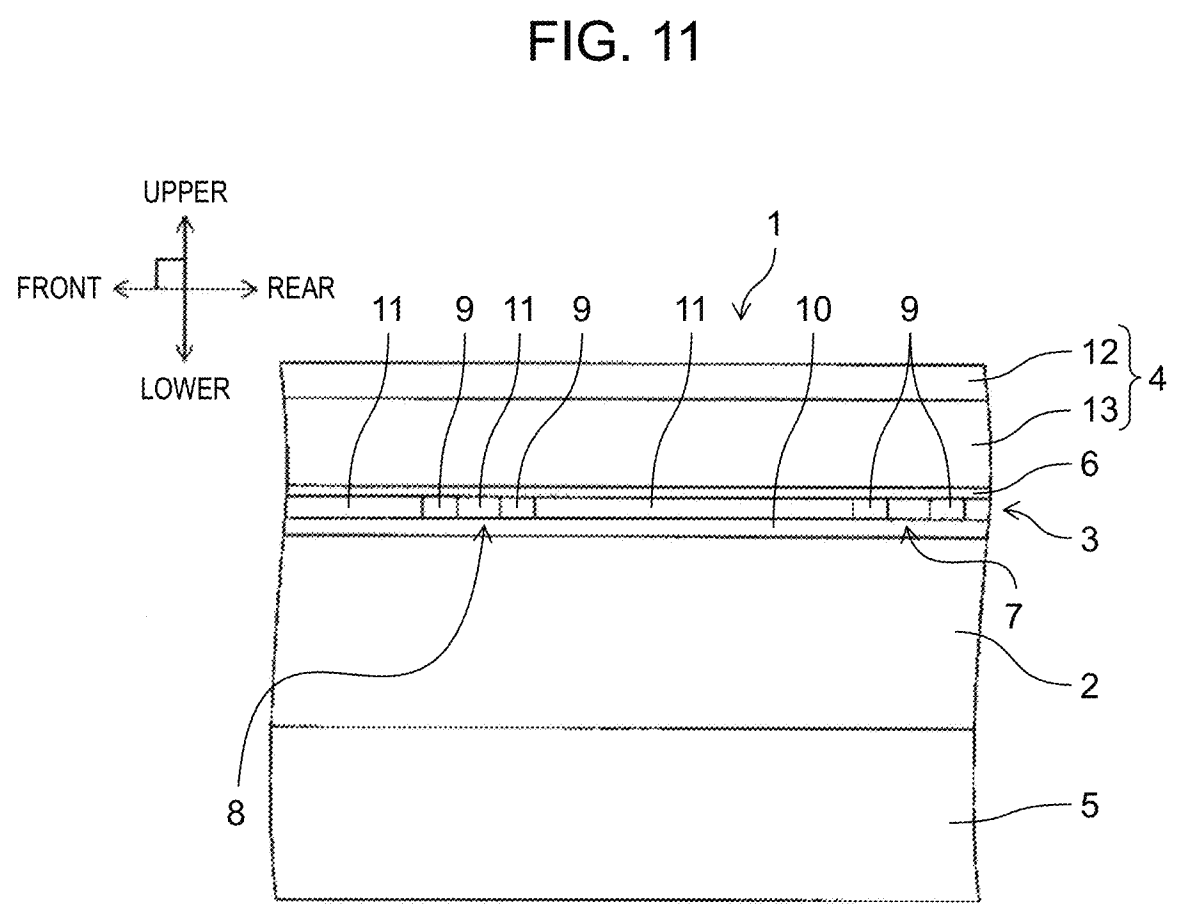

FIG. 11 is a cross-sectional view showing a configuration of a vehicle decoration display device of JP 2021-133695.

Figure 12:
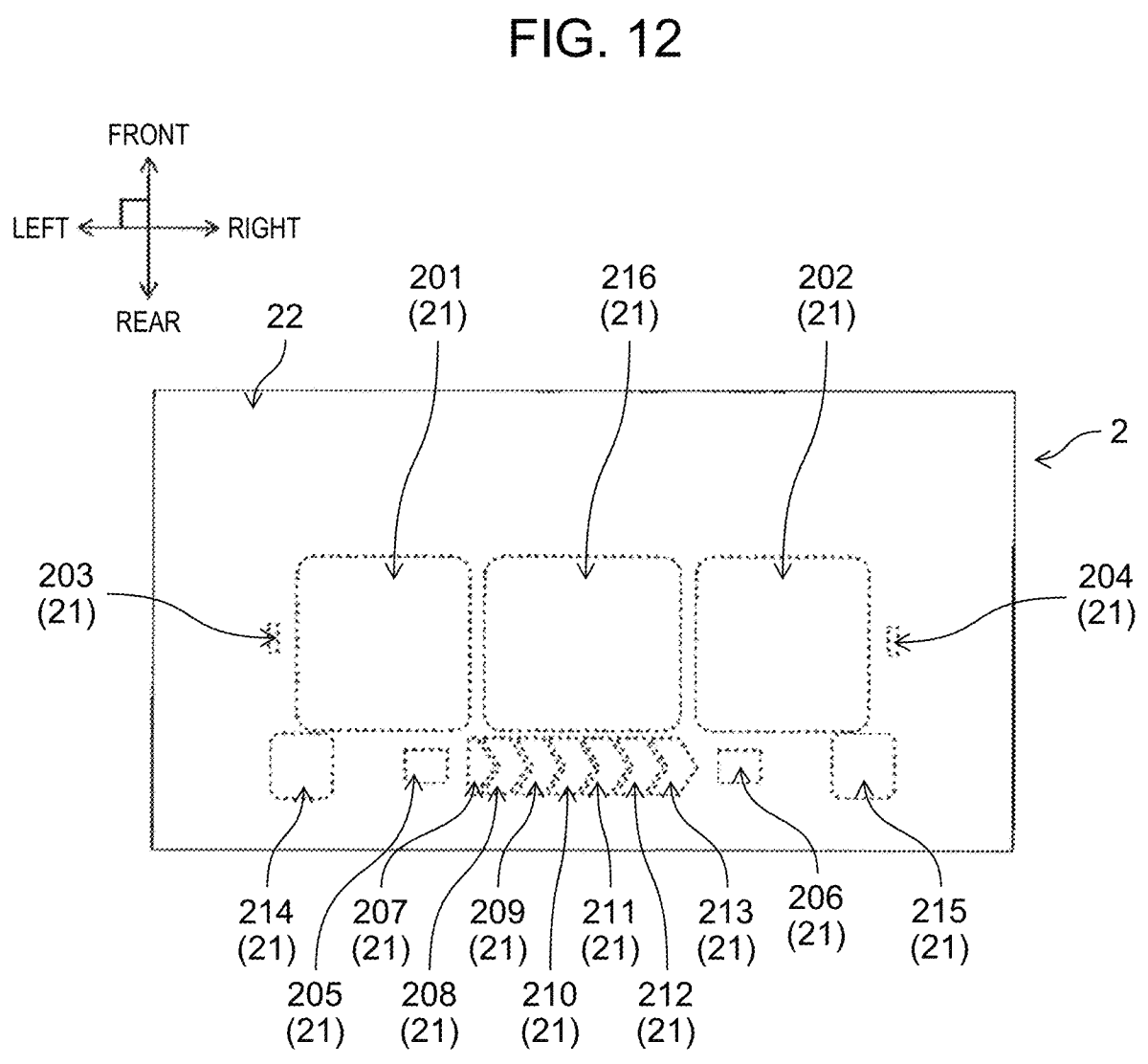

FIG. 12 is a top view illustrating a display of the vehicle decoration display device in FIG. 11.

DESCRIPTION OF EMBODIMENT

Figure 1:
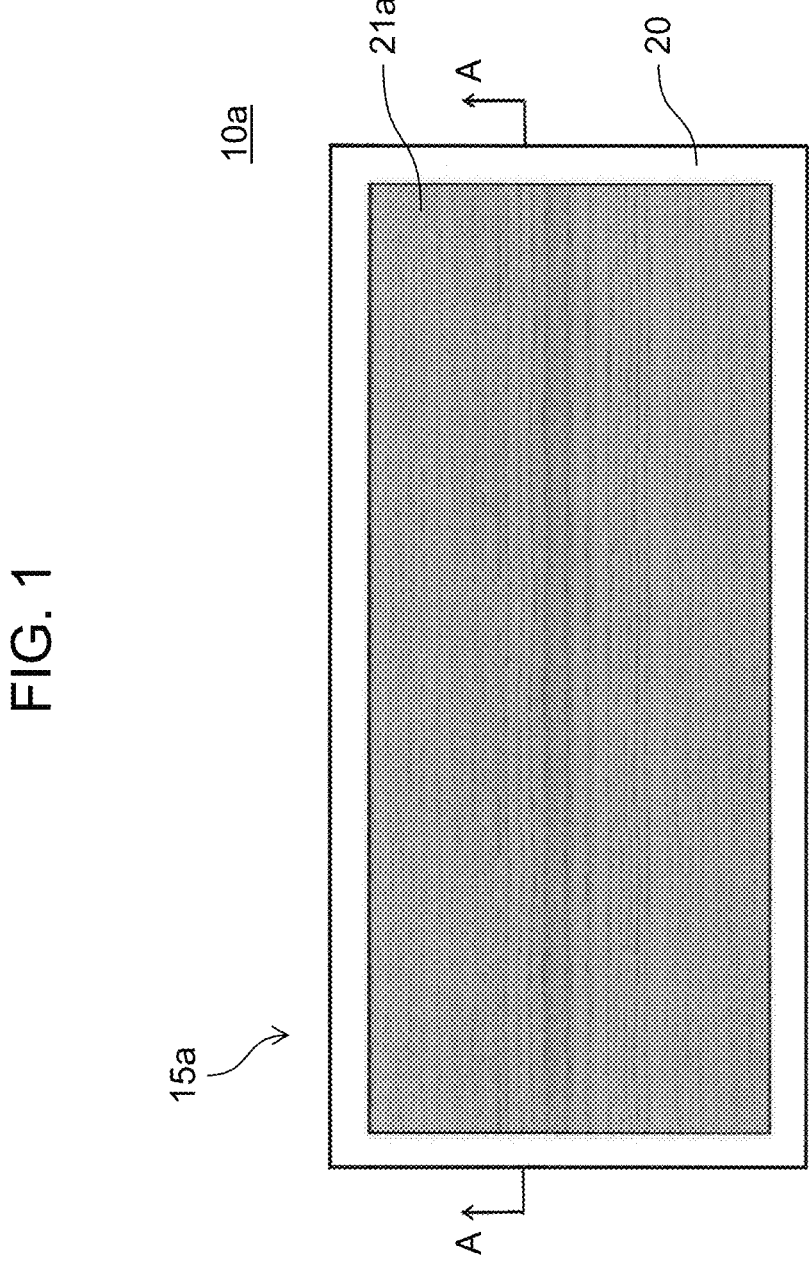
FIG. 1 is a top view illustrating an external appearance surface of a display member according to a first exemplary embodiment of the present disclosure.

According to a first aspect of the present disclosure, there is provided a display member including: a display layer disposed on a side of an external appearance surface and having a light transmission characteristic; and a decorative body disposed facing a surface on a side opposite to the external appearance surface of the display layer, in which the display layer has a display region on the surface on the side of the external appearance surface, and when the display layer is turned on, an output is visually recognized in the display region, and when the display layer is turned off, the decorative body is visually recognized through the display region.

According to this aspect, it is possible to provide a display member having a high degree of freedom in material selection of a decorative body and improving display quality of a display at the time of lighting.

According to a second aspect of the present disclosure, there is provided a display member according to the first aspect, in which the display layer is a self-luminous display layer including a self-luminous element, the self-luminous element emits light in the display region when the display layer is turned on, and the display layer is configured to provide one or more outputs including illumination light, symbol display, and video display by using the light emitted by the self-luminous element.

According to a third aspect of the present disclosure, there is provided a display member according to the second aspect, in which the display layer is an organic EL display layer including an organic EL element as a self-luminous element.

According to a fourth aspect of the present disclosure, there is provided a display member according to any one of the first to third aspects, in which the decorative body includes a material containing real wood, real leather, or stone.

According to a fifth aspect of the present disclosure, there is provided a display member according to any one of the first to third aspects, further including an adhesive layer provided between the decorative body and the display layer, in which the adhesive layer has a light transmittance of 50% or more and a thickness of 2 μm or more and 200 μm or less.

According to a sixth aspect of the present disclosure, there is provided a display member according to the fourth aspect, further including an adhesive layer provided between the decorative body and the display layer, in which the adhesive layer has a light transmittance of 50% or more and a thickness of 5 μm or more and 200 μm or less.

According to a seventh aspect of the present disclosure, there is provided a display member according to any one of the first to sixth aspects, further including a light adjustment layer provided between the display layer and the decorative body, in which the light adjustment layer controls transmittance of light incident on the decorative body by switching between a first state having a light transmission characteristic and a second state having a light non-transmission characteristic, when the display layer is turned on, causes the output and the decorative body to be superimposed and visually recognized in the display region when the light adjustment layer is in the first state, and hides the decorative body and causes the output to be visually recognized in the display region when the light adjustment layer is in the second state.

According to an eighth aspect of the present disclosure, there is provided a display member according to the seventh aspect, in which the light adjustment layer is a liquid crystal shutter layer that switches between a first state and a second state according to an applied voltage.

According to a ninth aspect of the present disclosure, there is provided a display member according to any one of the first to eighth aspects, further including a touch panel layer, in which when the display layer is turned on, the touch panel layer detects an adjacent conductive indication body and outputs a signal of position information by an operation of the conductive indication body, and the display layer provides an output in a display region based on the signal of the position information.

According to a tenth aspect of the present disclosure, there is provided a display member according to the ninth aspect, in which the touch panel layer includes an electrostatic sensor circuit and/or a gesture control-enabled module circuit.

According to an eleventh aspect of the present disclosure, there is provided a display member according to any one of the first to tenth aspects, further including a first functional layer provided on an upper layer side of the display layer, in which the first functional layer has a light transmission characteristic and includes at least one of a tactile layer, a coloring layer, a protective layer, and a release film layer.

According to a twelfth aspect of the present disclosure, there is provided a display member according to any one of the first to eleventh aspects, further including a second functional layer provided on an opposite side of a surface facing the external appearance surface of the decorative body, in which the second functional layer includes at least one of an adhesive layer that can be bonded to a resin, a heat resistant layer that mitigates thermal shock during insert molding, a reinforcing layer, and a support layer.

Note that by appropriately combining arbitrary exemplary embodiments among the various exemplary embodiments described above, the effects of the respective exemplary embodiments can be achieved.

Hereinafter, exemplary embodiments will be described in detail with appropriate reference to the drawings. Descriptions more in detail than necessary may not be described. For example, detailed descriptions of already well-known matters and duplicated description of substantially identical configurations may not be described. This is to avoid an unnecessarily redundant description below and to facilitate understanding of a person skilled in the art.

A display member according to an exemplary embodiment of the present disclosure will be described with reference to FIGS. 1 to 10. The accompanying drawings and the following description are provided for those skilled in the art to fully understand the present disclosure, and are not intended to limit the subject matter described in the claims in any way. Furthermore, in each of the drawings, elements are illustrated exaggeratedly in order to facilitate the description. Note that, in the drawings, substantially the same members are denoted by the same reference marks.

First Exemplary Embodiment (Configuration of Display Member)

Figure 2:
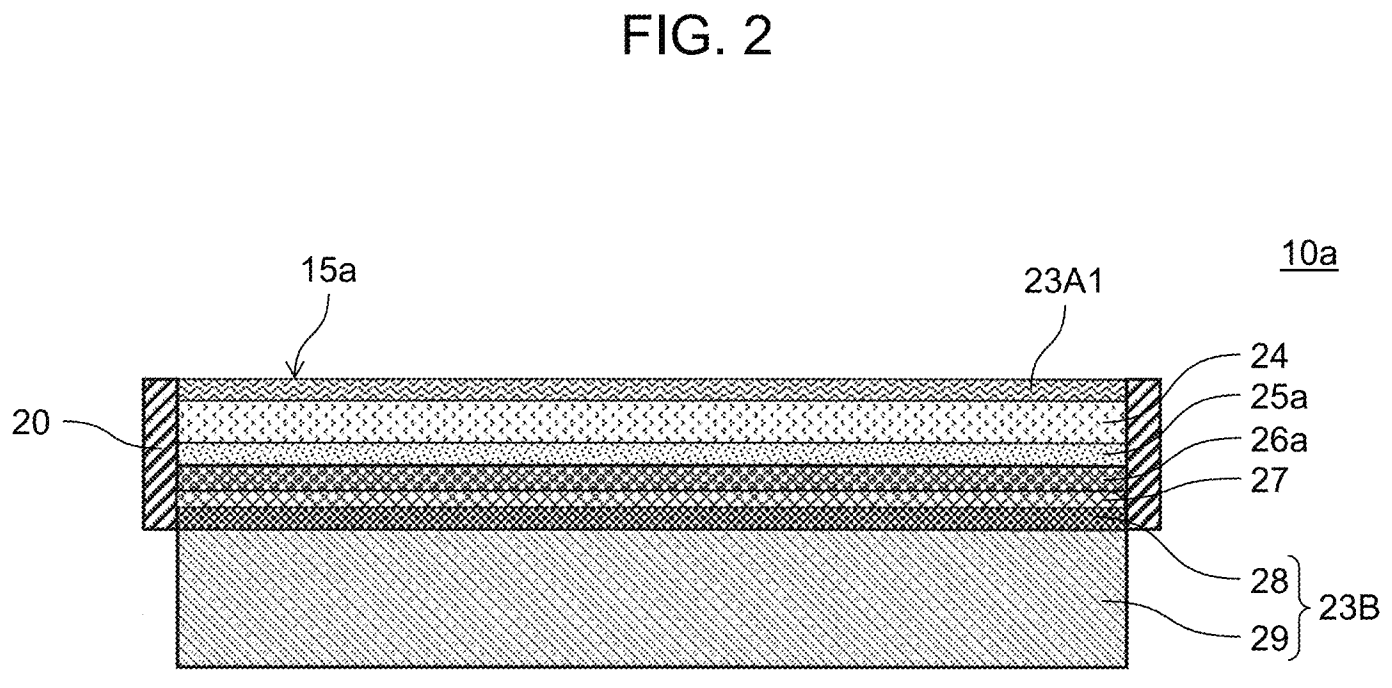
Figure 3:
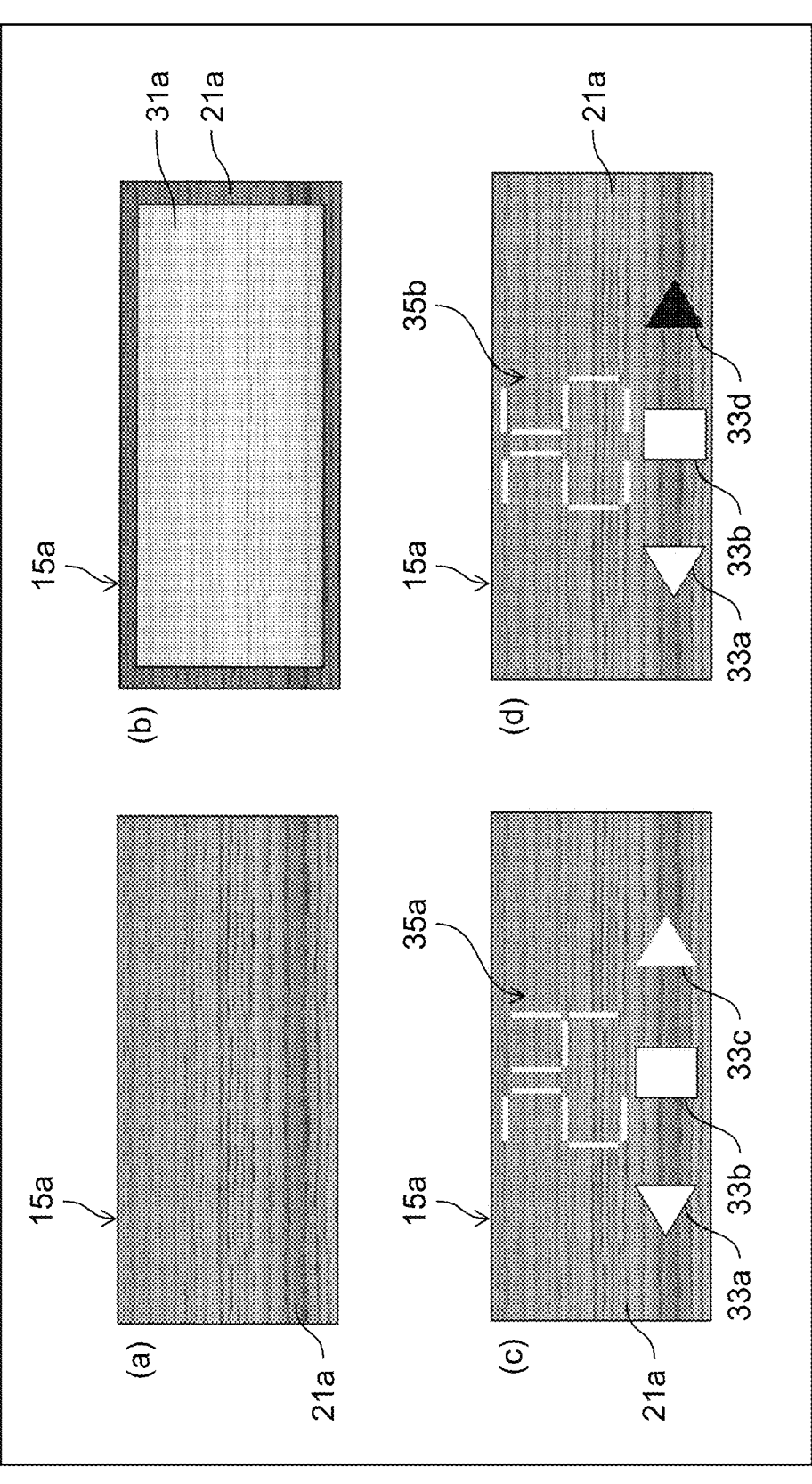
FIG. 3 is a top view illustrating a display example of the display member according to the first exemplary embodiment of the present disclosure.

A configuration of display member 10*a* according to a first exemplary embodiment of the present disclosure will be described with reference to FIGS. 1 to 3. FIG. 1 is a top view illustrating external appearance surface 15a of display member 10a according to the first exemplary embodiment of the present disclosure. FIG. 2 is a schematic cross-sectional view taken along line A-A illustrating an example of a configuration of display member 10a in FIG. 1. FIG. 3 is a top view illustrating a display example of display member 10a according to the first exemplary embodiment of the present disclosure.

The display member according to the exemplary embodiment of the present disclosure may be a plate-shaped molded article, and is applied to, for example, automobiles, home electric appliances, and the like, is connected to, for example, operation input devices of various devices such as audios and air conditioners, and can be used to display operation states of the various devices and perform operation input.

FIG. 1 illustrates external appearance surface 15a of display member 10a when the display layer is turned off. In the present exemplary embodiment, external appearance surface 15a of display member 10a includes display region 21a and outer peripheral portion 20 of display region 21a. As illustrated, when the display layer is turned off, display region 21a exhibits a woodgrain pattern. The woodgrain pattern exhibited when the display layer is turned off is an external appearance pattern designed on the viewing surface of the decorative body of display member 10a. The decorative body of display member 10a will be described in detail later. The outer peripheral portion 20 of display region 21a may be formed of, for example, a frame member, and can cover the wiring connection portion of the display layer so as not to be visually recognized in the external appearance surface. The configuration of the A-A line cross section of display member 10a will be described in detail with reference to FIG. 2.

In the present exemplary embodiment, as shown in FIG. 2, display member 10a includes upper functional layer 23A1, display layer 24, adhesive layer 25a, decorative body 26a, touch panel layer 27, and lower functional layer 23B in this order from external appearance surface 15a side. Each layer will be described below.

Upper functional layer 23A1 has a light transmission characteristic and is disposed on the upper surface of display member 10a, that is, on external appearance surface 15a side. Upper functional layer 23A1 can include, for example, one or more of a tactile layer that imparts a tactile sensation, a coloring layer that imparts a color, a protective layer for preventing deterioration due to ultraviolet rays or antifouling, and a release film layer that suppresses deformation of the tactile layer due to an injection pressure during injection molding. Furthermore, upper functional layer 23A1 can also be configured by a layer in which a plurality of functions, for example, a tactile sensation imparting function, a color imparting function, a protective function, and the like are integrated.

In the present exemplary embodiment, upper functional layer 23A1 is a tactile layer and is used as a presentation of the appearance of wood of display member 10a, and for example, a mat feeling can be imparted by an embossed shape. Tactile layer 23A1 can be made of, for example, a material having a light transmission characteristic such as an acrylic material or a urethane material, and has a thickness of about 5 μm to 10 μm in the present exemplary embodiment. In the case of improving the protective effect, tactile layer 23A1 can be configured by, for example, a hard coat specification.

Tactile layer 23A1 can adopt a tactile sensation imparting configuration according to a pattern expressed by a decorative body. For example, it may be configured by forming a pattern of wood, fine irregularities representing a pattern of stone, an embossed pattern of leather representing embossment of leather, or the like on the upper surface, and for example, it may be configured to impart a soft touch feeling and fingerprint resistance by being configured of a material having a rubber property.

Furthermore, as a functional configuration for insert molding, a release film serving both as protection and transfer that can be released after molding can be formed on the upper surface of tactile layer 23A1. As a result, it is possible to suppress deformation of the tactile layer due to the injection pressure on the surface of the mold at the time of injection molding, and it is possible to ensure excellent tactile sensation.

In the present exemplary embodiment, tactile layer 23A1 is provided on the upper surface of display layer 24 via adhesive layer 25 using gravure printing, inkjet printing, screen printing, or the like. However, the present disclosure is not limited to this. Tactile sensation protective layer 23A1 may be formed in a film shape and directly attached to the upper surface of display layer 24.

Display layer 24 disposed in the lower layer of tactile 23A1 has a light transmission characteristic, and can be configured by, for example, a self-luminous display layer including a self-luminous element. Display layer 24 has a first surface facing external appearance surface 15a and a second surface opposite to the first surface. The second surface of display layer 24 faces decorative body 26a. In the present exemplary embodiment, display layer 24 is a light-transmissive organic EL display layer including an organic electro luminescence (EL) element, and is configured in a film shape. When display layer 24 is turned on, the organic EL element emits light in display region 21a, and display layer 24 can provide various outputs including illumination light, symbol display, video display, and the like by using the light emitted by the organic EL element. When the display layer is turned off, the organic EL element is turned off, and decorative body 26a on the lower layer side is visually recognized through display layer 24.

When turned on, display layer 24 can display symbols, video, and the like with high definition as in normal display. In the case of insert-molding support, it is desirable that display layer 24 has film characteristics having flexibility and a shrinkage rate close to that of a molded resin. In the present exemplary embodiment, display layer 24 may have a light transmittance of 70% or more and a thickness of 0.5 mm or less.

In display member 10a of the present exemplary embodiment, as illustrated in the drawing, by providing display layer 24 on the upper layer side of decorative body 26a, the external appearance pattern applied to decorative body 26a is not visually recognized while covering the output of display layer 24 at the time of lighting, and the display quality can be improved as compared with the conventional decorative display device.

In the present exemplary embodiment, adhesive layer 25a is provided between display layer 24 and decorative body 26a. Adhesive layer 25a is a layer that plays a role of bringing display layer 24 and decorative body 26a into close contact with each other. Adhesive layer 25a may include a resin having affinity for both display layer 24 and decorative body 26a, for example, a polyacrylic resin, a polystyrene resin, a polycarbonate resin, or a polyamide resin.

Adhesive layer 25a can absorb the irregularity shape of decorative body 26a by its thickness to provide adhesion to display layer 24. In addition, adhesive layer 25a can have, for example, a light transmittance of 50% or more so as to ensure transparency. The thickness of adhesive layer 25*a* can be set according to the surface irregularities of decorative body 26*a*, and in the present exemplary embodiment, the adhesive layer can have a thickness of 2 µm or more and 200 µm or less.

Decorative body 26*a* under adhesive layer 25*a* is visually recognized as a color tone of an external appearance surface of a product when display layer 24 is turned off. By imparting various decoration designs to decorative body 26*a*, the design property of the product can be expressed. The color tone expressed by the decorative body is not particularly limited, and can be selected as desired. Examples thereof include woodgrain patterns imitating the appearance of the plate surfaces of various trees, woodgrain patterns imitating the surfaces of rocks such as marble and granite, woven fabric patterns imitating patterns of woven fabric and real leather, and emboss patterns of leather. In the present exemplary embodiment, decorative body 26*a* is a thin plate whose surface is printed with a woodgrain pattern. The woodgrain pattern can be designed according to the application, and for example, any woodgrain pattern such as a straight grain pattern, a plate grain pattern, or a figured grain pattern can be expressed.

In display member 10*a* of the present exemplary embodiment, as illustrated in the drawing, decorative body 26*a* is installed on the lower layer side of display layer 24, does not need to have a light transmission characteristic, can select a material with a high degree of freedom according to a design demand of a consumer, can realize various decoration designs, and can exhibit excellent decoration quality.

In the present exemplary embodiment, touch panel layer 27 is provided in the lower layer of decorative body 26*a*. Touch panel layer 27 can be configured, for example, by forming an electrostatic sensor circuit by an electrode pattern printed with an electrostatic sheet, an AG paste, or the like on a film-shaped substrate, and/or a gesture control-enabled module circuit. As the electrostatic circuit, a mesh-like touch film or the like can be used. Further, by mounting the electrostatic touch circuit on display layer 24, a touch panel layer integrated with the display layer can be configured (not illustrated).

In touch panel layer 27, for example, when a conductive indication body such as a user's finger approaches and performs a predetermined operation, a change in capacitance based on the operation can be detected by the electrostatic sensor. By outputting a signal of position information by the detected operation of the conductive indication body and directly or indirectly transmitting the signal to display layer 24, display layer 24 can provide an output according to the user's intention.

In the present exemplary embodiment, as shown in FIG. 2, touch panel layer 27 is disposed on a lower layer side of decorative body 26*a* with a lower surface (bonding surface) of decorative body 26*a* interposed therebetween. However, the present disclosure is not limited to this. Touch panel layer 27 may be disposed on the upper layer side of decorative body 26*a*, for example, between upper functional layer 23A1 and decorative body 26*a* (not illustrated). Touch panel layer 27 disposed on the upper layer side of decorative body 26*a* can be made of a material having a light transmission characteristic, and higher detection sensitivity can be realized.

In the present exemplary embodiment, as illustrated in FIG. 2, lower functional layer 23B is further provided in the lower layer of touch panel layer 27. Lower functional layer 23B can include, for example, at least one of an adhesive layer that can be bonded to a resin, a heat resistant layer that mitigates thermal shock during insert molding, a reinforcing layer, and a support layer. In addition, lower functional layer 23B can also be configured by a layer in which a plurality of performances, for example, adhesiveness, heat resistance, reinforcing property, support property, and the like are integrated. In the present exemplary embodiment, lower functional layer 23B includes backer layer 28 having both adhesiveness, heat resistance, and reinforcing property, and support layer 29.

Backer layer 28 may be formed using a nonwoven fabric or a resin film, for example, PET or a PC film, or may be formed using an insert-moldable resin, for example, a general-purpose molded resin such as a PC resin, a PMMA resin, an ABS resin, a PS resin, or a polyolefin-based resin. In the present exemplary embodiment, by providing backer layer 28, it is possible to alleviate the flow pressure and temperature of the resin for injection molding with respect to entire display member 10*a* at the time of insert molding, and it is possible to avoid a trouble of poor appearance at the time of insert molding.

Support layer 29 is an injection resin layer in the present exemplary embodiment, and backer layer 28 and support layer 29 are configured to be in close contact with each other by insert molding. However, the present disclosure is not limited to this. For example, support layer 29 may include another housing, for example, a resin plate or a glass plate, and an adhesive layer may be provided on backer layer 28 and attached to another housing as support layer 29.

(Display Example of Display Member)

A display example of display member 10*a* will be described with reference to FIG. 3. When display layer 24 is turned off, as shown in part (a) of FIG. 3, in display region 21*a*, the woodgrain pattern printed on the upper surface of decorative body 26*a* through display layer 24 is visually recognized. Furthermore, tactile layer 23A1 (not shown in FIG. 3) imparts a tactile sensation corresponding to the woodgrain tone of decorative body 26*a* to the uppermost surface of display member 10*a*, whereby the decorative body is recognized as interior using a decorative material designed together with texture and appearance.

Next, in a case of being applied to a separately installed switch, for example, an automobile, for example, when an ignition key of the automobile is turned, display layer 24 is turned on, and as illustrated in part (b) of FIG. 3, illumination light 31*a* can be output in display region 21*a*. At this time, as illustrated in the drawing, the illumination light 31*a* and the woodgrain pattern of decorative body 26*a* are visually recognized in a superimposed manner. Furthermore, as illustrated in part (c) of FIG. 3, in display region 21*a*, for example, operation marks 33*a*, 33*b*, and 33*c* and display 35*a* can be output. These outputs are visually recognized in a superimposed manner with the woodgrain pattern of decorative body 26*a*.

Furthermore, when the user who has confirmed the operation information illustrated in part (c) of FIG. 3 operates operation mark 33*c*, for example, display layer 24 receives a signal from touch panel layer 27, and as illustrated in part (d) of FIG. 3, in display region 21*a*, operation mark 33*d* and display 35*b* can be output according to the user's operation.

As described above, by mounting display member 10*a*, when the display layer is turned off, the interior having a high design property exhibiting a woodgrain appearance and texture is completely changed by turning on the display layer, and the display region appears. As a result, it is possible to provide design differentiation with a performance that gives surprise to the operator, and to provide various outputs with high display quality. In addition, display layer 24 of display member 10a of the present exemplary embodiment outputs not only a simple symbol mark or a still image but also illumination light, so that the user can easily perform in-vehicle operation even in a dark place, for example. In addition, by having a touch panel function and outputting a video display including a switch image and a moving image, the user can easily perform an input operation by touching a region indicating a desired operation and acquire information.

Second Exemplary Embodiment

Figure 4:
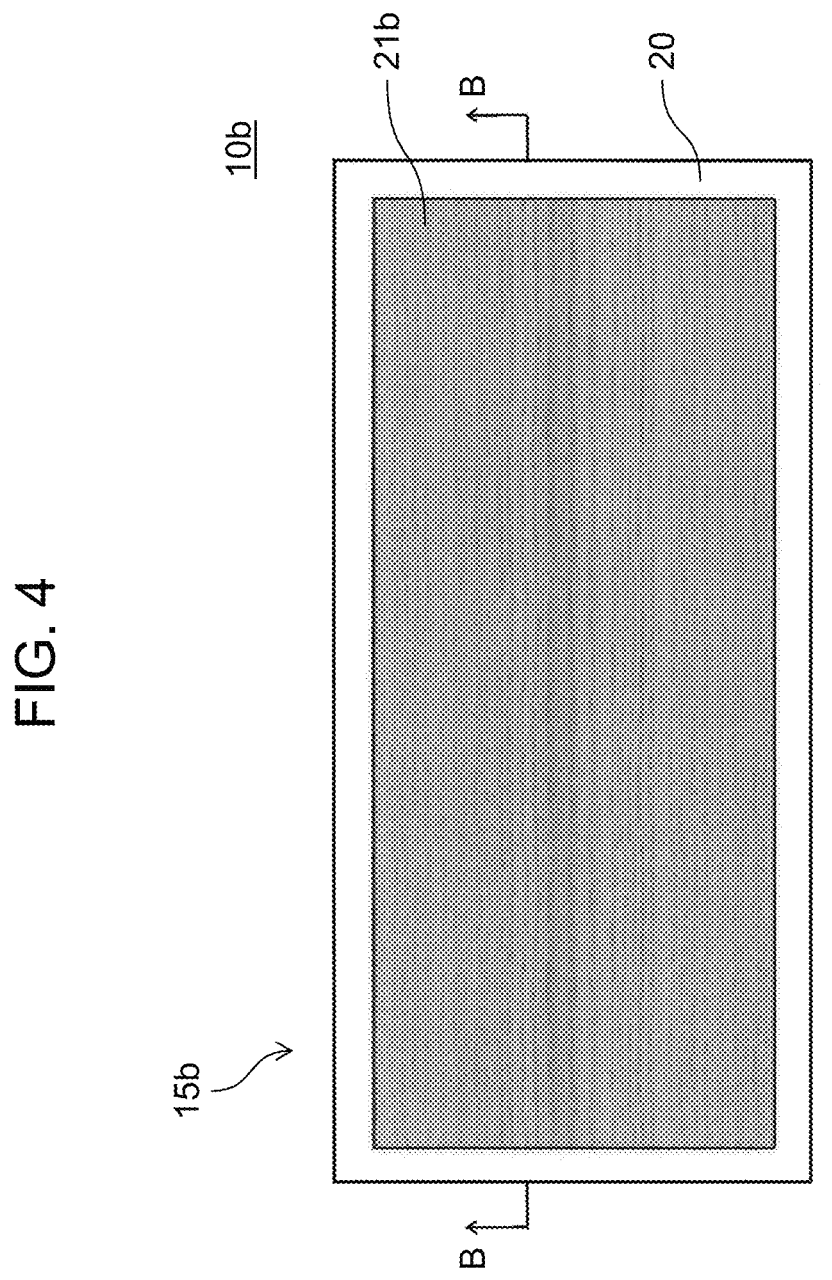
Figure 5:
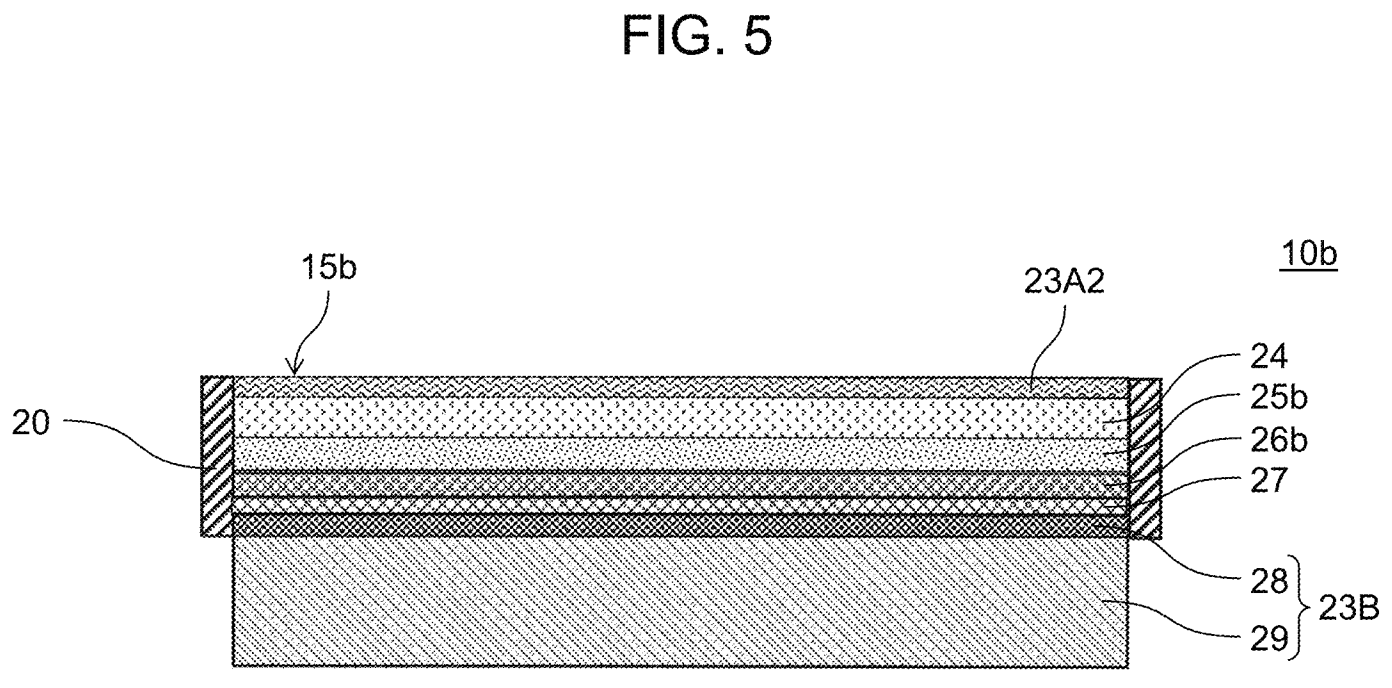
Figure 6:
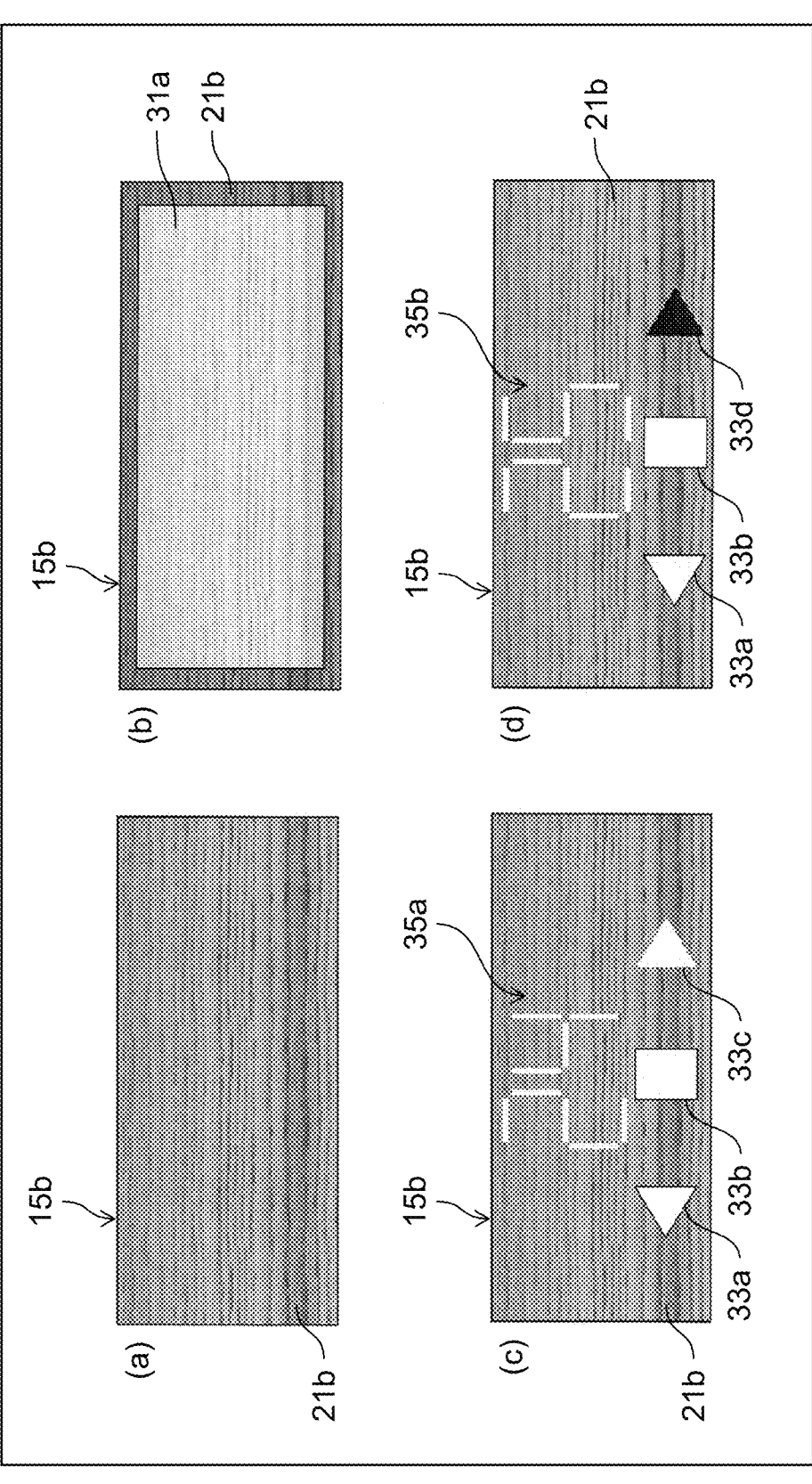
FIG. 6 is a top view illustrating a display example of the display member according to the second exemplary embodiment of the present disclosure.

A configuration of display member 10b according to the second exemplary embodiment of the present disclosure will be described with reference to FIGS. 4 to 6. FIG. 4 is a top view illustrating external appearance surface 15b of display member 10b according to the second exemplary embodiment of the present disclosure. FIG. 5 is a schematic cross-sectional view taken along line B-B illustrating an example of a configuration of display member 10b in FIG. 4. FIG. 6 is a top view illustrating a display example of display member 10b according to the second exemplary embodiment of the present disclosure. In FIGS. 4 to 6, the same elements as those of display member 10a illustrated in FIGS. 1 to 3 in display member 10b are denoted by the same reference numerals, and a detailed description thereof will be omitted.

FIG. 4 shows external appearance surface 15b of display member 10b when the display layer is turned off. In the present exemplary embodiment, as illustrated, external appearance surface 15b of display member 10b includes display region 21b and outer peripheral portion 20 of display region 21b. As illustrated, when the display layer is turned off, display region 21b exhibits a woodgrain pattern. The woodgrain pattern exhibited when the display layer is turned off is an external appearance pattern designed on the viewing surface of decorative body 26b of display member 10b.

In the present exemplary embodiment, as shown in FIG. 5, display member 10b includes upper functional layer 23A2, display layer 24, adhesive layer 25b, decorative body 26b, touch panel layer 27, and lower functional layer 23B in this order from external appearance surface 15b side. Display member 10b according to the second exemplary embodiment is different from display member 10a according to the first exemplary embodiment described above in the configuration of decorative body 26b.

In the present exemplary embodiment, decorative body 26b includes a material containing real wood, real leather, or stone, for example, as shown in FIG. 4, a sliced veneer obtained by thinly slicing natural wood. In addition to natural wood, a woven fabric such as fabric, real leather, metal, stone, or the like can also be used to form decorative body 26b. In display member 10b of the present exemplary embodiment, as shown in FIG. 5, decorative body 26b is installed on the lower layer side of display layer 24, and does not need to have a light transmission characteristic, and can be configured using various natural materials having a light non-transmission characteristic according to the design demand of the consumer. Accordingly, the decoration quality of the display member can be improved.

In the present exemplary embodiment, adhesive layer 25b is provided between display layer 24 and decorative body 26b. In the present exemplary embodiment, adhesive layer 25b has a light transmittance of 50% or more, and is configured to adhere display layer 24 and decorative body 26b in close contact. Adhesive layer 25b can absorb, by a thickness, an irregularity shape of a surface of a natural material constituting decorative body 26b, for example, a sliced veneer of natural wood to secure adhesion to display layer 24. The thickness of adhesive layer 25b can be set so as to absorb surface irregularities due to vessels of different sizes depending on the type of natural wood. In the present exemplary embodiment, adhesive layer 25b can have a thickness of, for example, 5 μm or more and 200 μm or less.

Other configurations of display member 10b according to the second exemplary embodiment are similar or similar to those of display member 10a according to the first exemplary embodiment, and thus detailed description thereof is omitted. Upper functional layer 23A2 of display member 10b may be configured as a tactile layer, and can adopt a configuration of decorative body 26b, for example, a tactile sensation imparting configuration according to a natural wood.

A display example of display member 10b will be described with reference to FIG. 6. When display layer 24 is turned off, as shown in part (a) of FIG. 6, in display region 21b, the pattern of the sliced veneer of decorative body 26b is visually recognized through display layer 24. Furthermore, tactile layer 23A2 (not shown in FIG. 6) imparts a tactile sensation corresponding to a natural wood of decorative body 26b to the uppermost surface of display member 10a, whereby the decorative body is recognized as an interior using a natural wood together with texture and appearance. Accordingly, the decoration quality can be improved.

Next, when display layer 24 is turned on, illumination light 31a can be output in display region 21b as illustrated in part (b) of FIG. 6. At this time, as illustrated in the drawing, illumination light 31a and the pattern of the sliced veneer of decorative body 26b are visually recognized in a superimposed manner. Furthermore, as illustrated in part (c) of FIG. 6, in display region 21b, for example, operation marks 33a, 33b, and 33c and display 35a can be output. These outputs are visually recognized in a superimposed manner with the pattern of the sliced veneer of decorative body 26b.

Furthermore, when the user who has confirmed the operation information illustrated in part (c) of FIG. 6 operates operation mark 33c, for example, display layer 24 receives a signal from touch panel layer 27, and as illustrated in part (d) of FIG. 6, in display region 21b, operation mark 33d and display 35b can be output according to the user's operation.

When display layer 24 is turned off, display member 10b configured as described above exhibits the appearance and texture of a natural material and can express excellent decoration quality, and when display layer 24 is turned on, the display member can provide various outputs with high display quality.

Third Exemplary Embodiment

Figure 7:
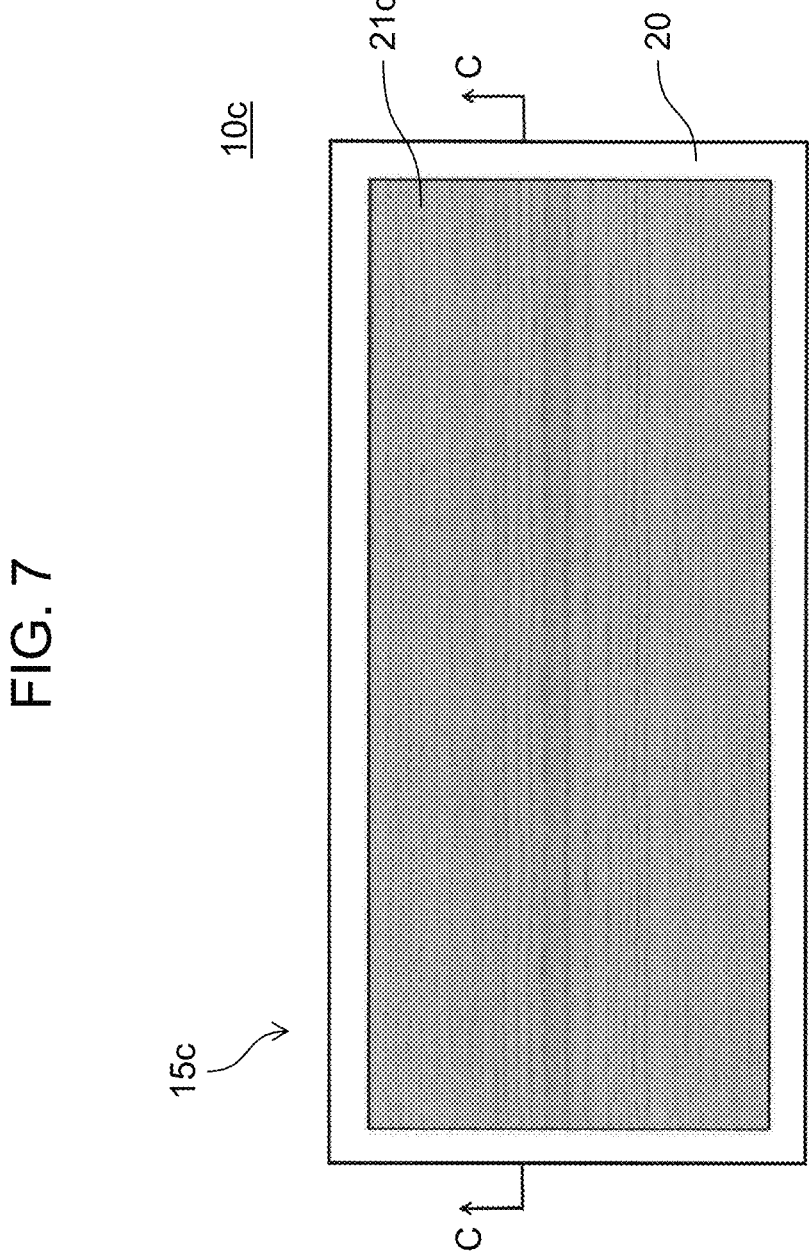
FIG. 7 is a top view illustrating an external appearance surface of a display member according to a third exemplary embodiment of the present disclosure.
Figure 8:
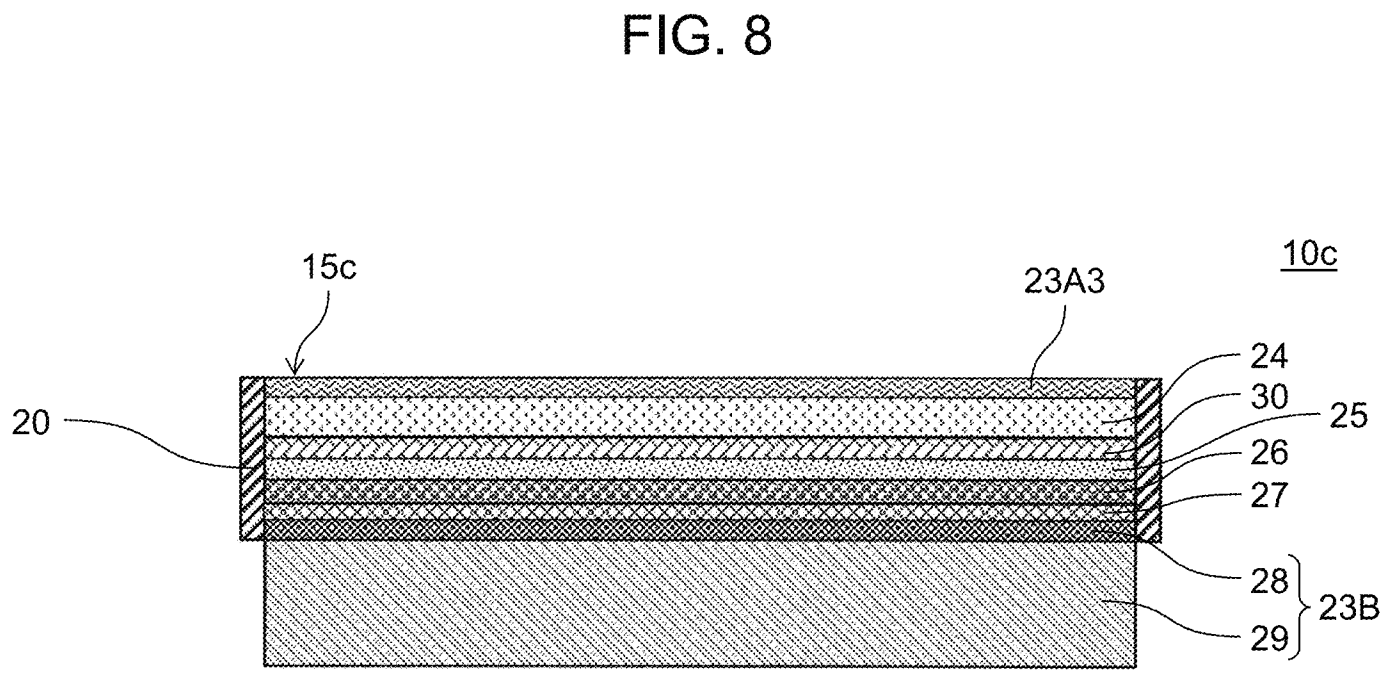
Figure 9:
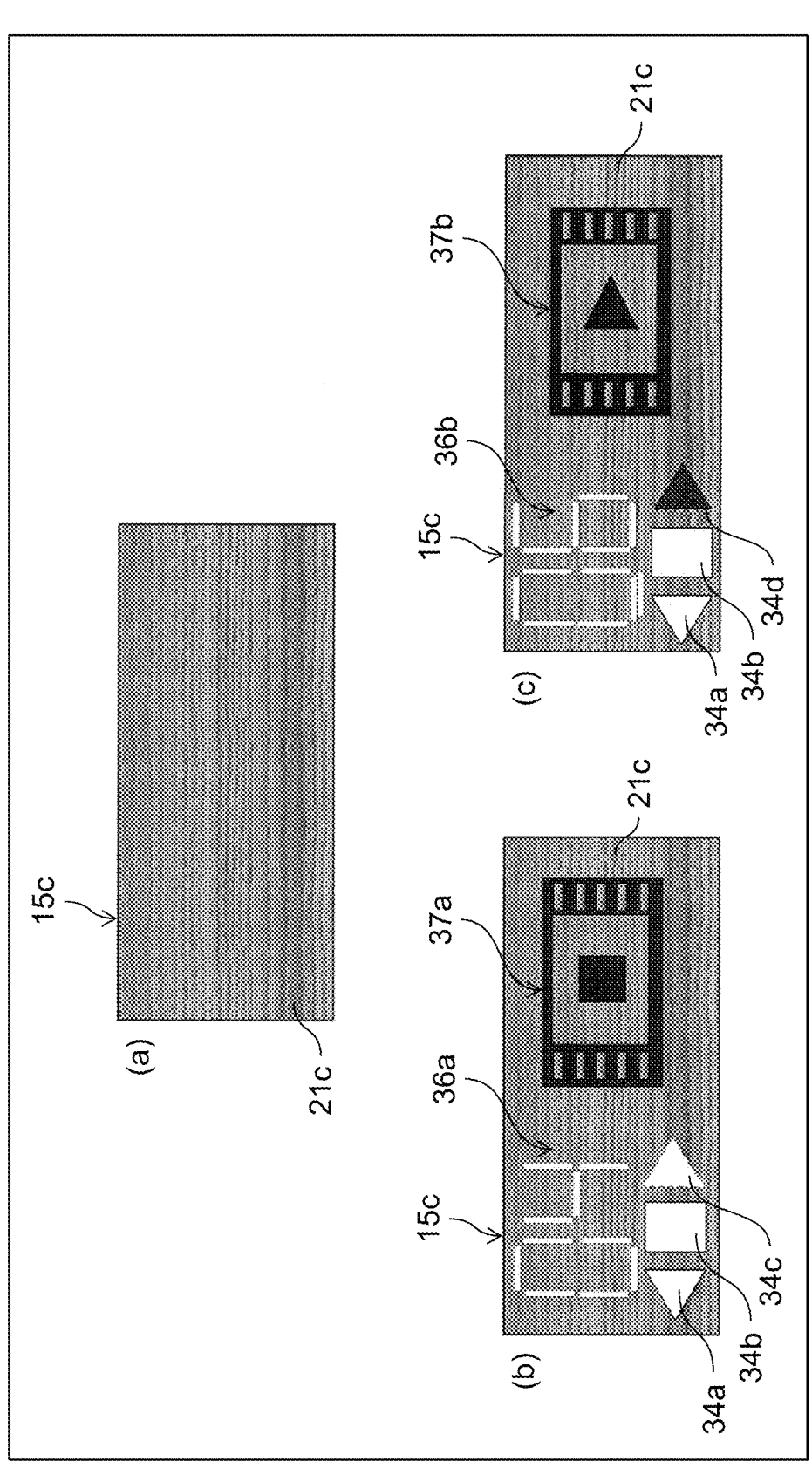
FIG. 9 is a top view illustrating a display example of the display member according to the third exemplary embodiment of the present disclosure.
Figure 10:
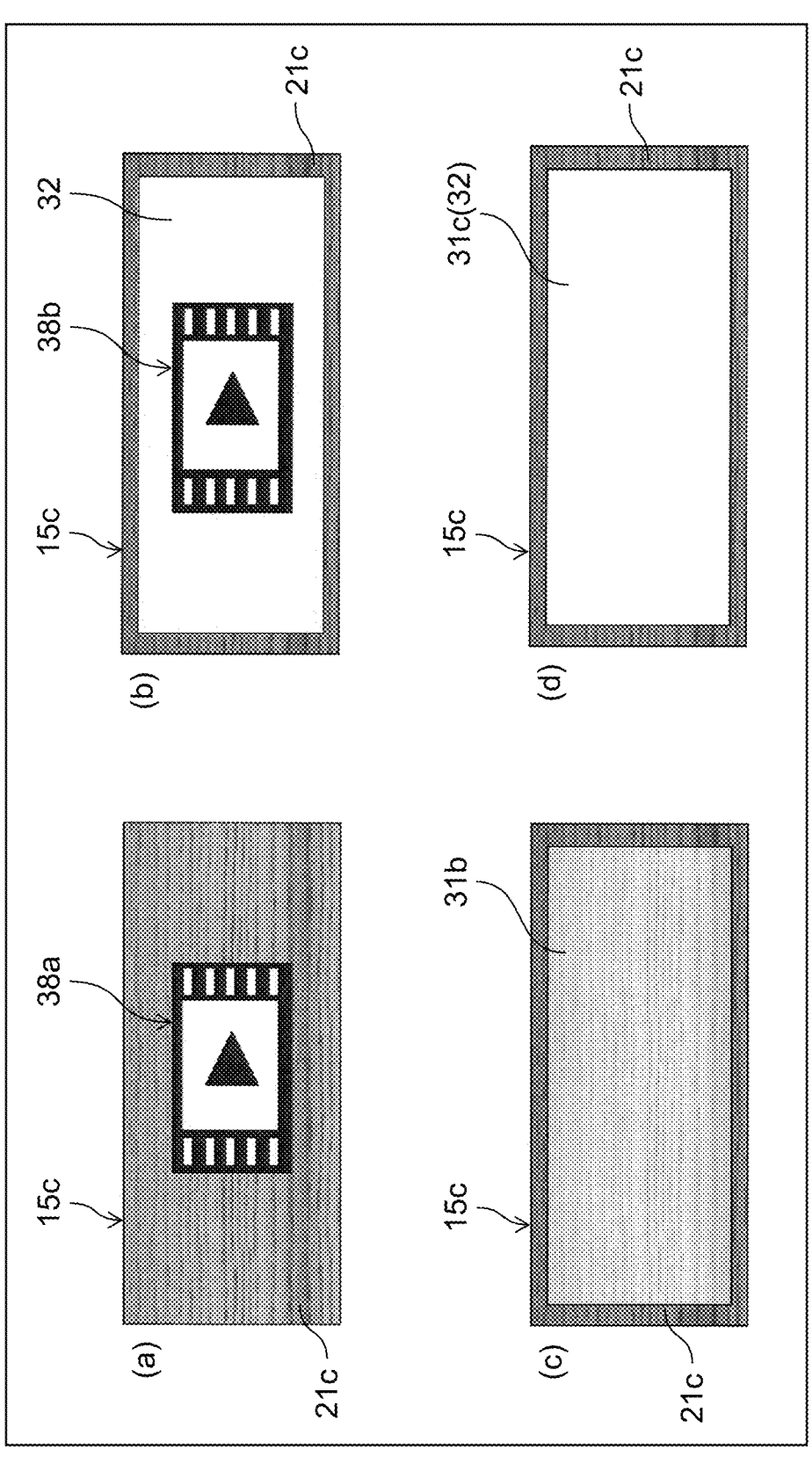
FIG. 10 is a top view illustrating a display example of the display member according to the third exemplary embodiment of the present disclosure and an operation example of a light adjustment layer.

A configuration of display member 10c according to a third exemplary embodiment of the present disclosure will be described with reference to FIGS. 7 to 10. FIG. 7 is a top view illustrating external appearance surface 15c of display member 10c according to the third exemplary embodiment of the present disclosure. FIG. 8 is a schematic cross-sectional view taken along line C-C illustrating an example of a configuration of display member 10c in FIG. 7. FIG. 9 is a top view illustrating a display example of display member 10c according to the third exemplary embodiment of the present disclosure. FIG. 10 is a top view illustrating a display example of the display member according to the third exemplary embodiment of the present disclosure and illustrating an operation example of the light adjustment layer. In FIGS. 7 to 10, the same elements as those of display member 10a illustrated in FIGS. 1 to 3 in display member 10c are denoted by the same reference numerals, and a detailed description thereof will be omitted.

FIG. 7 illustrates an external appearance surface 15c of display member 10c when the display layer is turned off. In the present exemplary embodiment, as illustrated in the drawing, external appearance surface 15c of display member 10c includes display region 21c and outer peripheral portion 20 of display region 21c. As illustrated, when the display layer is turned off, display region 21c exhibits a woodgrain pattern. The woodgrain pattern exhibited when the display layer is turned off is an external appearance pattern designed on the viewing surface of decorative body 26 of display member 10c.

In the present exemplary embodiment, as shown in FIG. 8, display member 10c includes upper functional layer 23A3, display layer 24, light adjustment layer 30, adhesive layer 25, decorative body 26, touch panel layer 27, and lower functional layer 23B in this order from external appearance surface 15c side.

In display member 10c according to the present exemplary embodiment, decorative body 26 may be configured using a thin plate obtained by printing a woodgrain pattern on the surface of decorative body 26a according to the first exemplary embodiment, or may be configured using a natural wood sliced veneer of decorative body 26b according to the second exemplary embodiment. In the present exemplary embodiment, adhesive layer 25 has a light transmittance of 50% or more, and is configured to adhere display layer 24 and decorative body 26 in a close contact manner. Upper functional layer 23A3 may be configured as a tactile layer, and a tactile sensation imparting configuration can be adopted according to the configuration of decorative body 26. Display member 10c according to the third exemplary embodiment is different from display member 10a according to the first exemplary embodiment and display member 10b according to the second exemplary embodiment described above in the configuration further including light adjustment layer 30.

(Light Adjustment Layer)

Light adjustment layer 30 can be provided between display layer 24 and decorative body 26. In the present exemplary embodiment, as illustrated in FIG. 8, light adjustment layer 30 is provided on the lower layer side of display layer 24 and on the upper layer side of decorative body 26 via adhesive layer 25. Light adjustment layer 30 and display layer 24 may be bonded to each other via an adhesive layer (not illustrated).

In the present exemplary embodiment, light adjustment layer 30 is a liquid crystal shutter layer, and can switch between a light transmission state and a light non-transmission state according to an applied voltage to control the transmittance of light incident on decorative body 26 on the lower layer side. The liquid crystal shutter layer is composed of a polymer liquid crystal composite film in which liquid crystal molecules are wrapped with a polymer. As the polymer liquid crystal used for the polymer liquid crystal composite film, for example, polymer network liquid crystal (PNLC) or polymer dispersed liquid crystal (PDLC) can be applied.

Specifically, when light adjustment layer 30 is turned on with a power source (not illustrated), the liquid crystal molecules are arranged along the electric field, so that there is no light scattering, and the light transmission state in which the liquid crystal shutter layer is transparent is obtained. In this state, decorative body 26 disposed on the lower layer side of light adjustment layer 30 is visible from the external appearance surface 15c. When display layer 24 is turned on, the external appearance pattern of decorative body 26 is superimposed on the output of display layer 24 and visually recognized from the external appearance surface 15c by the illumination of the light emitted from the organic EL element.

On the other hand, when the power source (not illustrated) is turned off, since the liquid crystal molecules are randomly arranged, the incident light is multiply scattered at the interface between the polymer and the liquid crystal, and the scattered light becomes remarkable and the liquid crystal shutter layer becomes cloudy. In this state, decorative body 26 disposed on the lower layer side of light adjustment layer 30 is hidden. When display layer 24 is turned on, light emitted from the organic EL element is not transmitted through light adjustment layer 30, and as a result, decorative body 26 is hidden, and only the output of display layer 24 is visually recognized from external appearance surface 15c.

Furthermore, light adjustment layer 30 can also be configured to be visually recognized in black from the external appearance surface 15c via a polarizing plate in a power-off state, for example, by laminating the polarizing plate (not illustrated) on the upper surface of the liquid crystal shutter layer. In the present exemplary embodiment, light adjustment layer 30 is formed in a film shape having a thickness of, for example, about 0.5 mm or less, and has a light transmittance of, for example, about 80% or more in a power-on state (not illustrated), and is configured to be cloudy or black in a power-off state to hide decorative body 26 on the lower layer side.

A display example of display member 10c will be described with reference to FIGS. 9 and 10. FIG. 9 illustrates a display example of display member 10c in a state where light adjustment layer 30 is in a power-on state, that is, in a light transmission state. At this time, when display layer 24 is turned off, as shown in part (a) of FIG. 9, in display region 21c, the woodgrain pattern of decorative body 26b is visually recognized through display layer 24 and light adjustment layer 30. Furthermore, tactile layer 23A3 (not shown in FIG. 9) imparts a tactile sensation corresponding to the configuration of decorative body 26 to the uppermost surface of display member 10c, whereby the decorative body is recognized as interior using a material designed together with texture and appearance.

Next, as illustrated in part (b) of FIG. 9, when display layer 24 is turned on, for example, operation marks 34a, 34b, and 34c, display 36a, and moving image stop screen 37a can be output in display region 21c. These outputs are visually recognized in a superimposed manner with the pattern of decorative body 26.

Furthermore, when the user who has confirmed the operation information illustrated in part (b) of FIG. 9 operates operation mark 34c or moving image stop screen 37a, for example, display layer 24 receives a signal from touch panel layer 27, and as illustrated in part (c) of FIG. 9, in display region 21c, operation mark 34d, display 36b, and moving image reproduction screen 37b can be output according to the user's operation. These outputs are visually recognized in a superimposed manner with the pattern of decorative body 26.

Next, an operation example of light adjustment layer 30 will be described with reference to FIG. 10. As illustrated in part (a) of FIG. 10, in a state where light adjustment layer 30 is in the power-on state, that is, in the light transmission state, display layer 24 can output moving image reproduction screen 38a in display region 21c. At this time, moving image reproduction screen 38a is visually recognized in a superimposed manner with the pattern of decorative body 26. Next, as illustrated in part (b) of FIG. 10, in a state where light adjustment layer 30 is in the power-off state, that is, in the light non-transmission state, shutter portion 32 is cloudy in display region 21c. At this time, decorative body 26 disposed on the lower layer side of light adjustment layer 30 is hidden, and clear moving image reproduction screen 38b can be output using the cloudy background of shutter portion 32.

Furthermore, as illustrated in part (c) of FIG. 10, in a state where light adjustment layer 30 is in the power-on state, that is, in the light transmission state, display member 10c can output illumination light 31b in display region 21c. At this time, illumination light 31b is visually recognized in a superimposed manner with the pattern of decorative body 26. Next, as illustrated in part (d) of FIG. 10, in a state where light adjustment layer 30 is in the power-off state, that is, in the light non-transmission state, shutter portion 32 is cloudy in display region 21c. At this time, decorative body 26 disposed in the lower layer of light adjustment layer 30 is hidden, and bright illumination light 31c can be output using the cloudy background of shutter portion 32.

As described above, display member 10c further including light adjustment layer 30 can provide a more highly visible output by hiding decorative body 26 disposed on the lower layer side of light adjustment layer 30 by controlling the transmittance of light incident on the decorative body by the liquid crystal shutter layer.

As described above, the accompanying drawings and the detailed description have been provided to describe exemplary embodiments of the technology in the present disclosure. Therefore, the components described in the accompanying drawings and the detailed description may include not only components essential for solving the problem but also components that are not essential for solving the problem in order to illustrate the above technique. Therefore, such non-essential components should not be immediately construed as essential merely on the basis of the fact that those non-essential components are illustrated in the accompanying drawings or described in the detailed descriptions.

Although the present disclosure has been fully described in connection with preferred exemplary embodiments with reference to the accompanying drawings, various modifications can be made within the scope of the claims. Such modifications and exemplary embodiments obtained by appropriately combining technical units disclosed in different exemplary embodiments are also included in the technical scope of the present disclosure.

INDUSTRIAL APPLICABILITY

The present disclosure is applicable to a display device including an in-vehicle display device, a home appliance display device, a mobile display device, and the like.

REFERENCE MARKS IN THE DRAWINGS 10a, 10b, 10c: display member
15a, 15b, 15c: external appearance surface
20: outer peripheral portion
21a, 21b, 21c: display region
23A1, 23A2, 23A3: upper functional layer, tactile layer
23B: lower functional layer
24: display layer

14

25, 25a, 25b: adhesive layer
26, 26a, 26b: decorative body
27: touch panel layer
28: backer layer
29: support layer
30: light adjustment layer
31a, 31b, 31c: illumination light
32: shutter portion
33a, 33b, 33c, 33d: operation mark
34a, 34b, 34c, 34d: operation mark
35a, 35b: display
36a, 36b: display
37a, 37b: video screen
38a, 38b: video screen

The invention claimed is:

1. A display member comprising:
a functional layer including an external appearance surface and an internal surface being opposite to the external appearance surface;
a display layer which has a light transmission characteristic, and includes a first surface facing the internal surface of the functional layer, and a second surface being opposite to the first surface; and
a decorative body which does not have a light transmission characteristic, and faces the second surface of the display layer,
wherein:
the display layer is on the decorative body;
the functional layer is on the first surface of the display layer;
the display layer includes a display region on the first surface;
the display layer is configured to have an output be visually recognizable in the display region when the display layer is turned on; and
the display layer is configured to have the decorative body be visually recognizable through the display region when the display layer is turned off.

2. The display member according to claim 1, wherein:
the display layer includes a self-luminous element;
the self-luminous element is configured to emit light in the display region when the display layer is turned on; and
the output includes illumination light, symbol display, or video display using the light emitted from the self-luminous element.

3. The display member according to claim 2, wherein the display layer is an organic electroluminescent (EL) display layer and the self-luminous element is an organic EL element.

4. The display member according to claim 1, wherein the decorative body includes real wood, real leather, or stone.

5. The display member according to claim 4, further comprising:
an adhesive layer between the decorative body and the display layer,
wherein the adhesive layer has a light transmittance of 50% or more and a thickness of 5 μm or more and 200 μm or less.

6. The display member according to claim 1, further comprising:
an adhesive layer between the decorative body and the display layer,
wherein the adhesive layer has a light transmittance of 50% or more and a thickness of 2 μm or more and 200 μm or less.

7. The display member according to claim 1, further comprising:

a light adjustment layer between the decorative body and the display layer, wherein:

the light adjustment layer is configured to:

control transmittance of light incident on the decorative body by switching between a first state having a light transmission characteristic and a second state having a light non-transmission characteristic;

cause, when the display layer is turned on, the output and the decorative body to be superimposed and visually recognizable in the display region when the light adjustment layer is in the first state; and hide, when the display layer is turned on, the decorative body and cause, when the display layer is turned on, the output to be visually recognizable in the display region when the light adjustment layer is in the second state.

8. The display member according to claim 7, wherein the light adjustment layer is a liquid crystal shutter configured to switch between the first state and the second state according to an applied voltage.

9. The display member according to claim 8, wherein the liquid crystal shutter layer includes a polymer liquid crystal composite film.

10. The display member according to claim 7, wherein the light adjustment layer is configured to switch between the first state and the second state according to an applied voltage.

11. The display member according to claim 7, wherein the light adjustment layer is configured to hide, when the display layer is turned on, the decorative body and cause, when the display layer is turned on, only the output to be visually recognizable in the display region when the light adjustment layer is in the second state.

12. The display member according to claim 1, further comprising:

a touch panel layer, wherein:

the touch panel layer is configured to detect, when the display layer is turned on, an adjacent conductive indication body and output, when the display layer is turned on, a signal of position information by an operation of the adjacent conductive indication body; and the display layer is configured to provide, when the display layer is turned on, the output in the display region based on the signal of position information.

13. The display member according to claim 12, wherein the touch panel layer includes an electrostatic sensor circuit.

14. The display member according to claim 13, wherein the touch panel layer includes a gesture control-enabled module circuit.

15. The display member according to claim 12, wherein the touch panel layer includes a gesture control-enabled module circuit.

16. The display member according to claim 1, wherein the functional layer includes at least one of a tactile layer, a coloring layer, a protective layer, or a release film layer.

17. The display member according to claim 1, wherein:

the functional layer is a first functional layer;

the display member further comprises a second functional layer on a side opposite to the first functional layer with respect to the decorative body; and the second functional layer includes at least one of an adhesive layer that can be bonded to a resin, a heat resistant layer configured to mitigate thermal shock during insert molding, a reinforcing layer, or a support layer.

18. The display member according to claim 1, wherein the decorative body includes real wood, real leather, and stone.

\* \* \* \* \*